(12) United States Patent
Kuo et al.

(10) Patent No.: US 7,639,504 B2
(45) Date of Patent: Dec. 29, 2009

(54) MOUNTING DEVICE FOR MOUNTING HEAT SINK ONTO ELECTRONIC COMPONENT

(75) Inventors: Jer-Haur Kuo, Taipei Hsien (TW); Xin-Xiang Zha, Shenzhen (CN); Ye-Fei Yu, Shenzhen (CN); Jun Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/119,514

(22) Filed: May 13, 2008

(65) Prior Publication Data

US 2009/0244851 A1    Oct. 1, 2009

(30) Foreign Application Priority Data

Mar. 26, 2008   (CN) .................... 2008 1 0066347

(51) Int. Cl.
*H05K 7/20*    (2006.01)
*F28F 7/00*    (2006.01)
*H01L 23/34*   (2006.01)

(52) U.S. Cl. .................. 361/719; 165/80.2; 165/185; 257/719

(58) Field of Classification Search ......... 257/718–719; 361/719–720

See application file for complete search history.

(56) References Cited

U.S. PATENT DOCUMENTS

| | | | | |
|---|---|---|---|---|
| 5,570,721 A | * | 11/1996 | Funke et al. | 137/625.65 |
| 6,229,706 B1 | * | 5/2001 | Cook et al. | 361/719 |
| 6,714,416 B1 | * | 3/2004 | McLeod et al. | 361/719 |
| 6,788,538 B1 | * | 9/2004 | Gibbs et al. | 361/704 |
| 6,992,893 B2 | * | 1/2006 | Miyamura et al. | 361/705 |
| 7,426,112 B2 | * | 9/2008 | Chi-Wei et al. | 361/700 |
| 2003/0106670 A1 | * | 6/2003 | Lee et al. | 165/80.3 |
| 2004/0252463 A1 | * | 12/2004 | Wu | 361/719 |
| 2005/0068740 A1 | * | 3/2005 | Ulen et al. | 361/719 |
| 2006/0158857 A1 | * | 7/2006 | Luckner et al. | 361/719 |
| 2007/0236886 A1 | * | 10/2007 | Yang et al. | 361/700 |
| 2007/0242437 A1 | * | 10/2007 | Tien et al. | 361/700 |
| 2008/0291638 A1 | * | 11/2008 | Ma et al. | 361/719 |

* cited by examiner

*Primary Examiner*—Gregory D Thompson
(74) *Attorney, Agent, or Firm*—Frank R. Niranjan

(57) ABSTRACT

A mounting device (10) for mounting a heat sink (20) to a printed circuit board (40) on which a heat generating electronic component (30) is disposed, includes a mounting frame (100), two clasping legs (104) and four resilient arms (105). The mounting frame includes two first mounting arms (101) and two second mounting arms (102) disposed above the first mounting arms. The first mounting arms abut on the circuit board. The clasping legs connect with the second mounting arms and are inserted through the printed circuit board to be attached to the printed circuit board. The resilient arms connect with the second mounting arms and exert a downward resilient force on the heat sink toward the heat generating electronic component.

15 Claims, 4 Drawing Sheets

MOUNTING DEVICE FOR MOUNTING HEAT SINK ONTO ELECTRONIC COMPONENT

BACKGROUND

1. Technical Field

The present invention generally relates to mounting devices, and particularly to a mounting device for mounting a heat sink onto a heat generating electronic component.

2. Description of Related Art

It is well known that heat is generated during operations of a variety of electronic components, such as integrated circuit chips. To ensure normal and safe operations, cooling devices such as heat sinks are often employed to dissipate the generated heat away from these electronic components, and mounting devices are often employed to mount the cooling devices onto these electronic components.

A conventional way to secure the cooling device onto the electronic component is to screw a base of the heat sink onto a printed circuit board on which the electronic component is mounted. However, a magnitude of a force exerted on the electronic component is difficult to be controlled. If the force is greater than a predetermined value, the electronic component will be damaged. If the force is smaller than the predetermined value, an intimate contact between the heat sink and the electronic component will not be kept.

What is needed, therefore, is a mounting device which can properly exert a predetermined force on the electronic component.

SUMMARY

The present invention relates to a mounting device for mounting a heat sink to a printed circuit board on which a heat generating electronic component is disposed. According to an embodiment of the present invention, the mounting device includes a mounting frame, two clasping legs and four resilient arms. The mounting frame includes two first mounting arms and two second mounting arms disposed above the first mounting arms. The first mounting arms abut on the circuit board. The clasping legs connect with the second mounting arms and are inserted through the printed circuit board to be attached to the printed circuit board. The resilient arms connect with the second mounting arms and exert a downward resilient force on the heat sink toward the heat generating electronic component.

Other advantages and novel features of the present invention will become more apparent from the following detailed description of embodiments when taken in conjunction with the accompanying drawings.

DETAILED DESCRIPTION OF THE EMBODIMENTS

Figure 1:
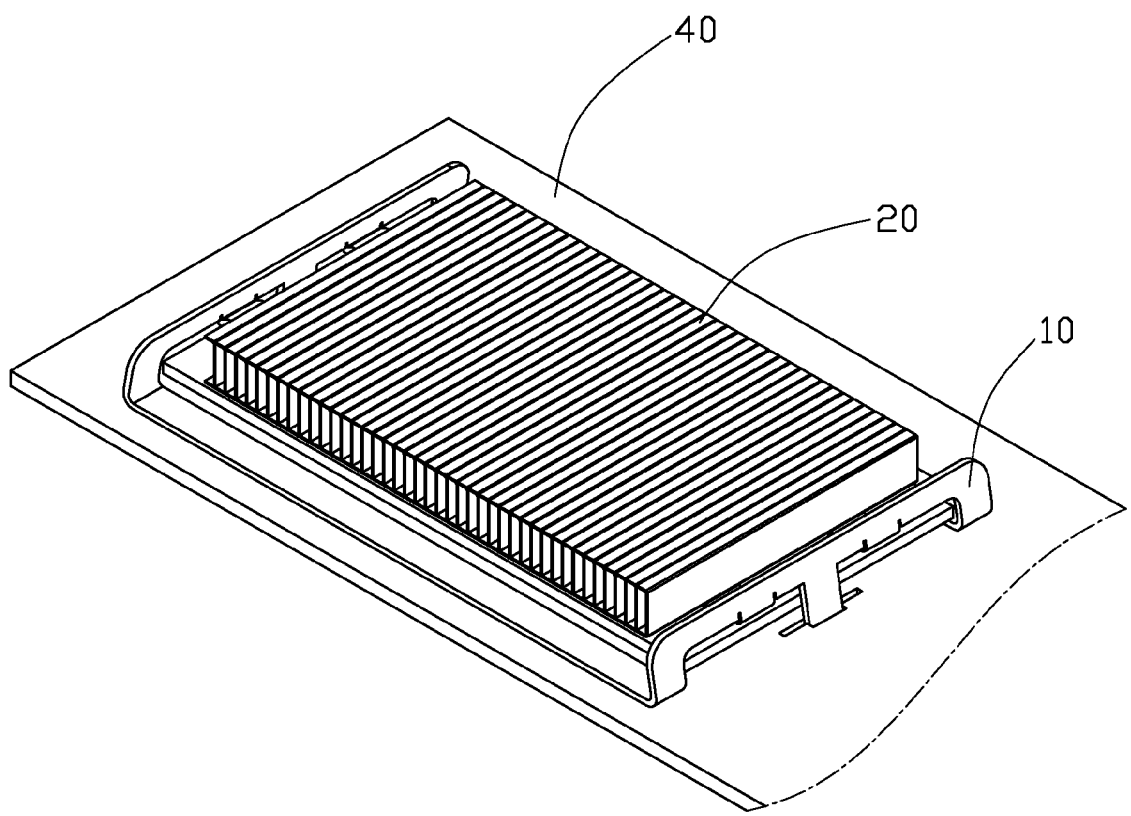
FIG. 1 an assembled view of an electronic apparatus incorporating a mounting device in accordance with a first embodiment of the present invention.

Reference will now be made to the drawing figures to describe the various present embodiments in detail.

Figure 2:
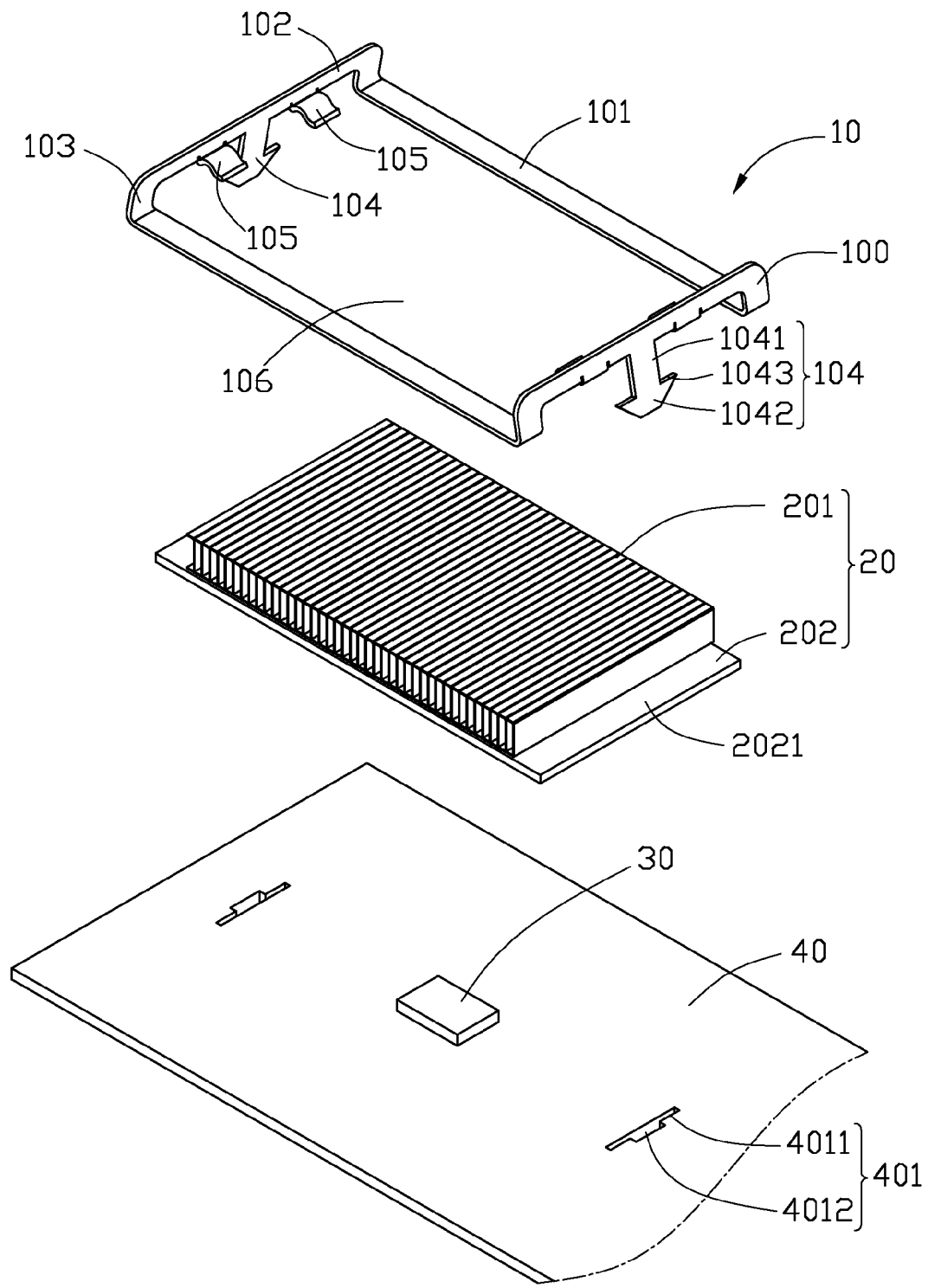
FIG. 2 is an exploded, isometric view of the electronic apparatus of FIG. 1.

Referring to FIGS. 1 and 2, an electronic apparatus in accordance with an embodiment of the present invention is shown. The electronic apparatus includes a printed circuit board 40, a heat generating electronic component 30, a heat sink 20 and a mounting device 10.

The heat generating electronic component 30 is disposed on the printed circuit board 40. The heat sink 20 is positioned on the heat generating electronic component 30 for dissipating heat generated by the heat generating electronic component 30. The mounting device 10 is used for mounting the heat sink 20 onto the heat generating electronic component 30.

The mounting device 10 includes a mounting frame 100, a pair of clasping legs 104 and two pairs of resilient arms 105.

The mounting frame 100 is substantially rectangular shaped as viewed from a top thereof and is integrally formed by punching a single metal plate. An inner space 106 is defined at a middle portion of the mounting frame 100, for receiving the heat sink 20 therein. The inner space 106 is enclosed by a pair of first mounting arms 101, a pair of second mounting arms 102 and two pairs of connecting arms 103 of the mounting frame 100. The first mounting arms 101 are disposed at two opposite longer sides of the mounting frame 100 and the second mounting arms 102 are disposed at two opposite shorter sides of the mounting frame 100 which are perpendicular to the longer sides. The first mounting arms 101 are parallel to and space a distance from each other. The connecting arms 103 extend upwardly and slantingly from opposite ends of the first mounting arms 101 and connect to ends of the second mounting arms 102. A distance between two adjacent connecting arms 103, which are located at two opposite ends of each of the first mounting arms 101, gradually decreases along a direction from the first mounting arm 101 toward the second mounting arm 102. In other words, the connecting arms 103 extend slantingly and inwardly from the first mounting arm 101 toward the second mounting arm 102. Each of the second mounting arms 102 connects integrally with top ends of adjacent connecting arms 103 and spans across the first mounting arms 101. The second mounting arm 102 spaces a distance from the first mounting arm 101 along a height direction of the mounting frame 100. In other words, the second mounting arms 102 are located at a higher horizontal level than the first mounting arms 101.

The clasping leg 104 extends downwardly and slantingly from a middle portion of each of the second mounting arms 102 toward the printed circuit board 40. A distance between the clasping legs 104 gradually increases along a top-to-bottom direction of the clasping legs 104. That is, the clasping leg 104 extends slantingly and outwardly from the second mounting arm 102 toward the printed circuit board 40. The clasping leg 104 includes a neck portion 1041 integrally connected with the second mounting arm 102, and a trapezoid hook portion 1042 integrally connected with a bottom end of the neck portion 1041. A width of the hook portion 1042 gradually increases from a bottom end toward a top end thereof. A width of the top end of the hook portion 1042 is greater than a width of the neck portion 1041. Two shoulders 1043 are therefore formed at two opposite sides of the hook portion 1042.

Figure 3:
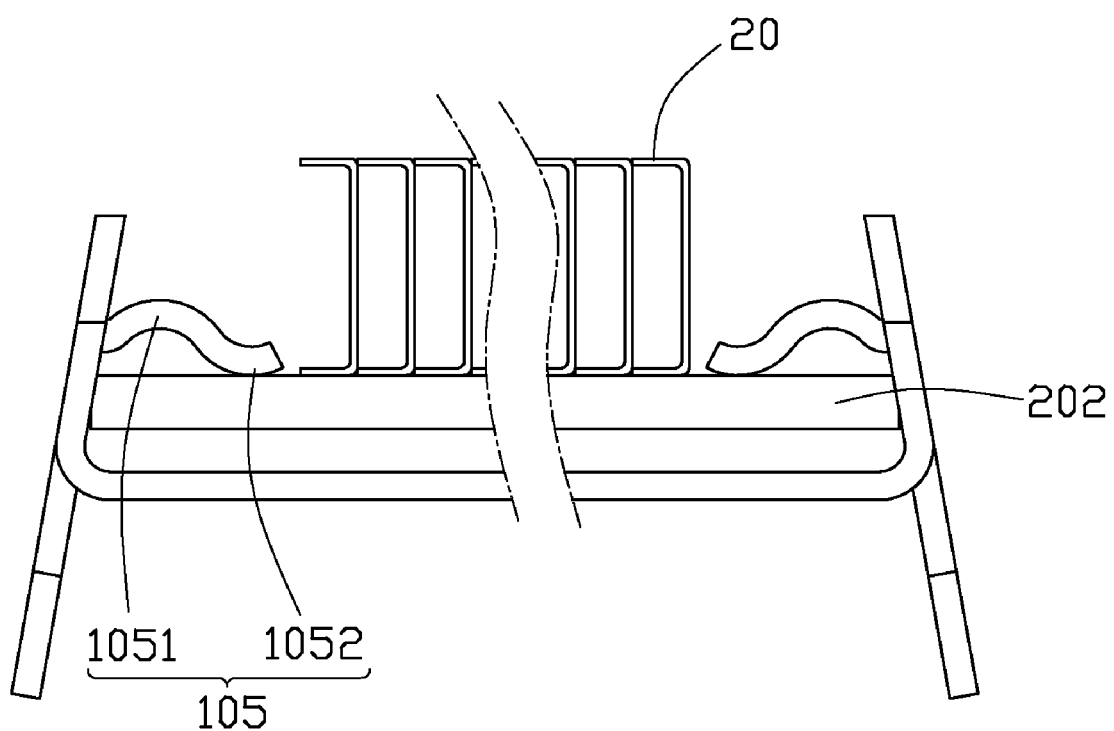
FIG. 3 is an explanatory, side view of the electronic apparatus of FIG. 1.

The resilient arm 105 extends inwardly from the second mounting arm 102 toward the inner space 106 of the mounting frame 100. Each pair of the resilient arms 105 are located adjacent to two opposite sides of each of the clasping legs 104. Referring to FIG. 3, the resilient arm 105 is S-shaped in profile. Each of the resilient arms 105 includes a crest 1051 adjacent to the second mounting arm 102, and a trough 1052 remote away from the second mounting arm 102.

Referring back to FIG. 1, the heat sink 20 includes a base 202 and a fin assembly 201 arranged on the base 202. Lateral ends of the base 202 space a distance from corresponding lateral ends of the fin assembly 201. Two supporting surfaces 2021 are therefore formed at the lateral ends of the base 202.

The printed circuit board 40 defines two T-shaped through holes 401 for the clasping legs 104 to extend therethrough. The through hole 401 includes a wide portion 4011 adjacent to the heat generating electronic component 30, and a narrow portion 4012 remote away from the heat generating electronic component 30. A width of the wide portion 4011 of the through hole 401 substantially equals to the width of the top end of the hook portion 1042 of the clasping leg 104. A width of the narrow portion 4012 substantially equals to the width of the neck portion 1041 of the clasping leg 104. A distance between the wide portions 4011 of the through holes 401 is less than a distance between the top ends of the hook portions 1042 of the clasping legs 104.

Referring to FIG. 3, in assembly of the electronic apparatus, the heat sink 20 is placed on the heat generating electronic component 30. The mounting device 10 is placed around the heat sink 20. Meanwhile, the clasping legs 104 are pressed inwardly toward each other and downwardly toward the printed circuit board 40 until the hook portions 1042 of the clasping legs 104 extend through the wide portions 4011 of the through holes 401 of the printed circuit board 40. Afterwards, the clamping force acting on the clasping legs 104 is released; the neck portions 1041 of the clasping legs 104 accordingly move outwardly toward the narrow portions 4012 of the through holes 401 of the printed circuit board 40 under a resilient force generated by the clasping legs 104. The neck portions 1041 of the clasping legs 104 are therefore received in the narrow portions 4012 of the through holes 401 of the printed circuit board 40, and the shoulders 1043 of the hook portions 1042 of the clasping legs 104 abut against a bottom surface of the printed circuit board 40. In this position, the first mounting arms 101 contact with a top surface of the printed circuit board 40. The resilient arms 105 contact with the supporting surfaces 2021 of the heat sink 20 and exert a resilient force on the heat sink 20 to press the heat sink 20 downwardly toward the printed circuit board 40, thereby mounting the heat sink 20 onto the heat generating electronic component 30.

In the present electronic apparatus, the heat sink 20 is urged toward the heat generating electronic component 30 by the resilient force generated by the resilient arms 105 of the mounting device 10. A deformation of the resilient arm 105 can be controlled by controlling a vertical distance between the top end of the hook portion 1042 of the clasping leg 104 and a bottom surface of the resilient arm 105. Therefore, a magnitude of the resilient force generated by the resilient arm 105 can be controlled within a predetermined desired force, which keeps an intimate contact between the heat sink 20 and the heat generating electronic component 30 without damaging the heat generating electronic component 30.

Figure 4:
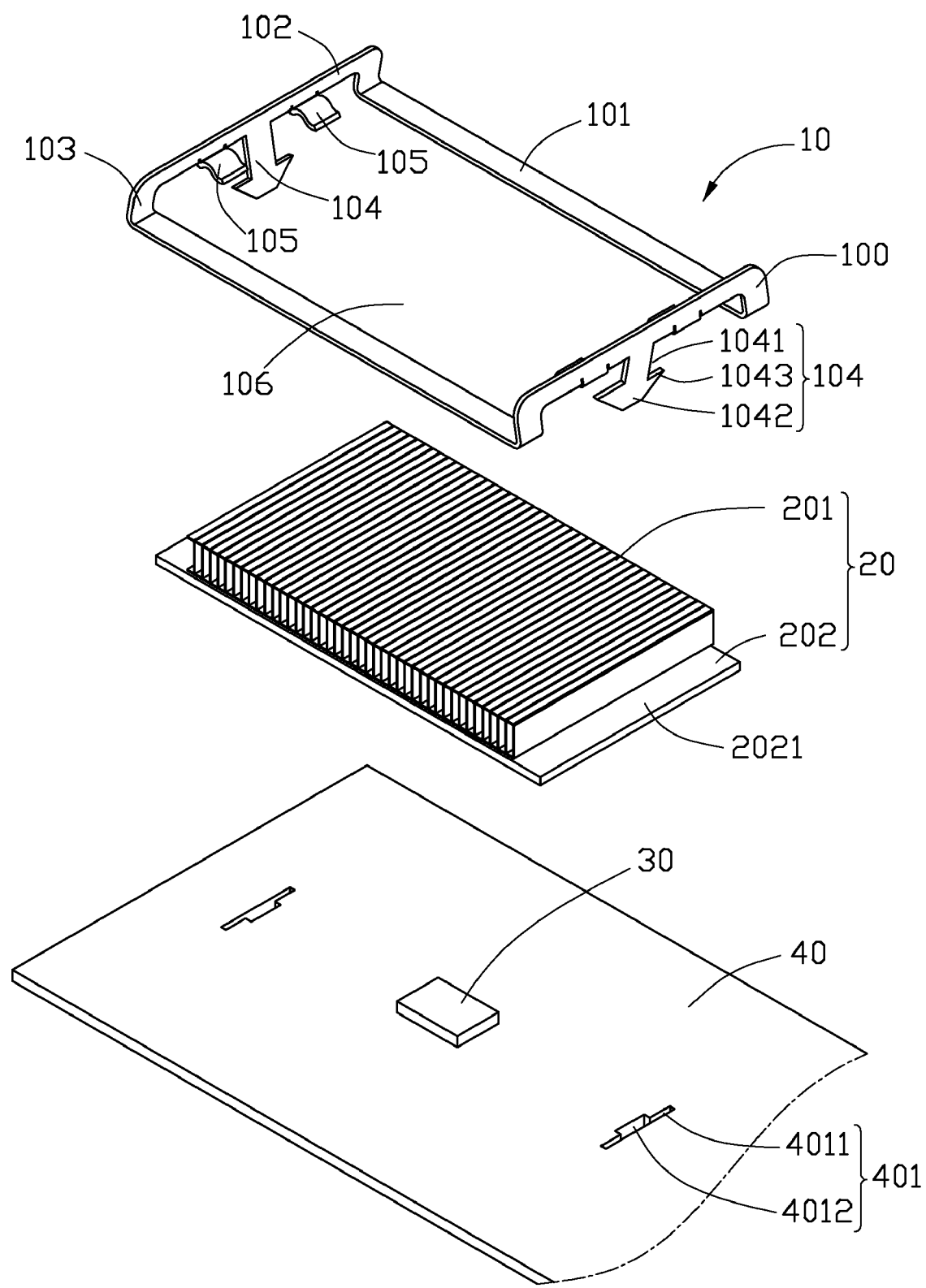
FIG. 4 is an exploded, isometric view of an electronic apparatus incorporating a mounting device in accordance with a second embodiment of the present invention.

Referring to FIG. 4, a second embodiment of the mounting device 10 is shown. The difference between the second embodiment and the first embodiment is: in the second embodiment, the clasping leg 104 extends slantingly and inwardly from the second mounting arm 102 toward the printed circuit board 40. That is, a distance between the two clasping legs 104 gradually decreases along a top-to-bottom direction of the clasping legs 104. The narrow portion 4012 of the through hole 401 is disposed adjacent to the heat generating electronic component 30, and the wide portion 4011 of the through hole 401 is disposed remote away from the heat generating electronic component 30. In assembly, the clasping legs 104 are pulled outwardly so that the clasping legs 104 are aligned with the wide portions of the through holes 401 of the printed circuit board 40. Then, the clasping legs 104 are pushed downwardly until the hook portions 1042 of the clasping legs 104 extend through the wide portions 4011 of the through holes 401. Thereafter the clasping legs 104 are released from the outwardly pulling force acting thereon, and the neck portions 1041 of the clasping legs 104 move accordingly inwardly toward the narrow portions 4012 of the through holes 401. The neck portions 1041 of the clasping legs 104 are therefore received in the narrow portions 4012 of the through holes 401, and the shoulders 1043 of the hook portions 1042 of the clasping legs 104 abut against the bottom surface of the printed circuit board 40.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electronic apparatus comprising:
a circuit board with a heat generating electronic component disposed thereon;
a heat sink; and
a mounting device for mounting the heat sink onto the heat generating electronic component, the mounting device comprising a mounting frame, at least two clasping legs, and at least two resilient arms, the mounting frame comprising two first mounting arms and two second mounting arms disposed above the first mounting arms, the heat sink being enclosed in an inner space defined between the first mounting arms and the second mounting arms, the first mounting arms abutting on the circuit board, the at least two clasping legs each connecting with one of the second mounting arms of the mounting frame and being inserted through the circuit board to be attached to the circuit board, the at least two resilient arms each connecting with one of the second mounting arms of the mounting frame and exerting a downward resilient force on the heat sink toward the heat generating electronic component.

2. The electronic apparatus of claim 1, wherein the mounting frame further comprises four connecting arms, each of the four connecting arms extending upwardly from a free end of one of the first mounting arms and connecting with a free end of a corresponding one of the second mounting arms.

3. The electronic apparatus of claim 2, wherein a distance between two adjacent connecting arms, which are located at two opposite ends of each of the first mounting arms, gradually decreases from the first mounting arms toward the second mounting arms.

4. The electronic apparatus of claim 1, wherein each of the at least two clasping legs extends downwardly, slantingly and outwardly from one of the second mounting arms toward the circuit board.

5. The electronic apparatus of claim 1, wherein each of the at least two clasping legs extends downwardly, slantingly and inwardly from one of the second mounting arms toward the circuit board.

6. The electronic apparatus of claim 1, wherein each of the at least two clasping legs includes a neck portion integrally connected with one of the second mounting arms, and a trapezoid hook portion integrally connected with a bottom end of the neck portion, a width of a top end of the hook portion being greater than a width of the neck portion.

7. The electronic apparatus of claim 1, wherein each of the at least two resilient arms extends inwardly from one of the second mounting arms toward the inner space of the mounting frame, and each of the at least two resilient arms includes a crest integrally connected with one of the second mounting arms, and a trough remote away from one of the second mounting arms.

8. A mounting device configured for mounting a heat sink to a circuit board on which a heat generating electronic component is disposed, the mounting device comprising:

a mounting frame comprising two first mounting arms and two second mounting arms disposed above the first mounting arms;

at least two clasping legs each connected with one of the second mounting arms of the mounting frame, configured for being inserted through the circuit board to be attached to the circuit board; and at least two resilient arms each connected with one of the second mounting arms of the mounting frame, configured for exerting a downward resilient force on the heat sink toward the heat generating electronic component;

wherein each of the at least two resilient arms extends inwardly from one of the second mounting arms toward an inner space of the mounting frame, and each of the at least two resilient arms includes a crest integrally connected with one of the second mounting arms, and a trough remote away from one of the second mounting arms.

9. The mounting device of claim 8, wherein the mounting frame further comprises four connecting arms, each of the connecting arms extending upwardly from a free end of one of the first mounting arms and connecting a free end of a corresponding one of the second mounting arms.

10. The mounting device of claim 9, wherein a distance between two adjacent connecting arms which are located at two opposite ends of each of the first mounting arms, gradually decreases along a direction from the first mounting arms toward the second mounting arms.

11. The mounting device of claim 8, wherein each of the at least two clasping legs extends downwardly from one of the second mounting arms toward the circuit board.

12. The mounting device of claim 11, wherein a distance between the at least two clasping legs gradually increases along a top-to-bottom direction of the at least two clasping legs.

13. The mounting device of claim 11, wherein a distance between the at least two clasping legs gradually decreases along a top-to-bottom direction of the at least two clasping legs.

14. The mounting device of claim 11, wherein each of the at least two clasping legs includes a neck portion integrally connected with one of the second mounting arms, and a trapezoid hook portion integrally connected with a bottom end of the neck portion, a width of a top end of the hook portion being greater than a width of the neck portion.

15. The mounting device of claim 8, wherein each of the at least two resilient arms is S-shaped in profile.

\* \* \* \* \*